United States Patent [19]
Yaguchi et al.

[11] Patent Number: 5,710,527
[45] Date of Patent: Jan. 20, 1998

[54] COMPLEMENTARY VOLTAGE TO CURRENT CONVERSION FOR VOLTAGE CONTROLLED OSCILLATOR

[75] Inventors: Yugi Yaguchi, Dejima-mura; Hidetoshi Onuma, Matsushiro Tukuba, both of Japan

[73] Assignee: Texas Instruments Incorporated, Dallas, Tex.

[21] Appl. No.: 716,075

[22] Filed: Sep. 19, 1996

[51] Int. Cl.⁶ .................................................. H03B 5/24
[52] U.S. Cl. ........................... 331/57; 331/34; 331/143; 331/177 R; 331/185; 327/543
[58] Field of Search .................. 331/34, 57, 111, 331/143, 177 R, 185; 327/530, 538, 543

[56] References Cited

U.S. PATENT DOCUMENTS 5,600,284  2/1997  Nguyen et al. .................. 331/34 X

*Primary Examiner*—David Mis
*Attorney, Agent, or Firm*—Robert D. Marshall, Jr.; James C. Kesterson; Richard L. Donaldson

[57] ABSTRACT

A voltage controlled oscillator has a linear voltage to current characteristic from ground to the supply voltage. This oscillator includes a voltage to current converter which employs two output current paths. The first output current path includes an N-type MOSFET whose gate receives the input voltage. A level shifter circuit receives the input voltage and provides an output voltage shifted up by an amount equal to the input threshold voltage of an N-type MOSFET. A clamp circuit connected to the output of the level shifter circuit prevents this output voltage from becoming greater than a voltage equal to the sum of the input threshold voltage of an N-type MOSFET and the input threshold voltage of a P-type MOSFET. The gate of the second N-type MOSFET receives the output of the level shifter as clamped by the clamp circuit. A current mirror circuit supplies a current control to ring oscillator, whose frequency depends upon the current. A second embodiment includes a new ring oscillator. The voltage to current converter supplies two pair of N-type MOSFETs. The ring oscillator includes two phase control circuits, one for opposite phases of the oscillatory output.

25 Claims, 3 Drawing Sheets

COMPLEMENTARY VOLTAGE TO CURRENT CONVERSION FOR VOLTAGE CONTROLLED OSCILLATOR

TECHNICAL FIELD OF THE INVENTION

The technical field of this invention is voltage controlled oscillators such as used in phase locked loop circuits.

BACKGROUND OF THE INVENTION

Phase locked loop circuits typically consists of a phase/frequency detector, a voltage controlled oscillator, a frequency divider circuit and a low pass filter. The phase/frequency detector detects the phase and/or frequency difference between a stable reference frequency and a signal derived from the voltage controlled oscillator. The filtered output of the low pass filter supplies the control voltage to the input of voltage controlled oscillator, which generates the desired output signal. The voltage controlled oscillator also typically supplies a frequency divider circuit whose output is supplied to phase/frequency detector. The phase locked loop circuit acts like a negative feedback system with the output of the low pass filter serving as the feedback error source. Once stably locked on the reference frequency, the phase locked loop circuit output is nearly as stable as the reference frequency source. Control of the division ratio permits generation of selected multiples of the reference frequency.

The typical known voltage controlled oscillator employed consists of a voltage to current converter, a current mirror and a ring oscillator. The voltage input controls a primary current supplied to the current mirror via the voltage to current converter. The current mirror output controls rate of charge and/or discharge of a capacitor. The ring oscillator produces an oscillatory output having a frequency related to this rate of charge movement and hence to the input voltage.

Such a conventional voltage controlled oscillator has a problem. The active voltage range of voltage input is between the positive supply voltage and the turn on threshold voltage of the input transistor. When the voltage input is between ground and the threshold voltage of the input transistor, this transistor is cut off. Thus controlled current is zero, and there is no control of the frequency of the ring oscillator. This is disadvantageous due to reduction of possible control range. With the continued migration to smaller devices and lower power supply voltages, the percentage of potential useful control range lost due to the turn on voltage threshold becomes greater.

SUMMARY OF THE INVENTION

One embodiment of this invention provides a voltage to current converter for use in a voltage controlled oscillator having a linear voltage to current characteristic from ground to the supply voltage. This voltage to current converter employs two current paths, one similar to that known in the art, and a second including a voltage shifter.

The voltage to current converter of this invention includes first and second N-type MOSFETs. The gate of the first N-type MOSFET receives the input voltage. A level shifter circuit receives the input voltage and provides an output voltage shifted up by an amount equal to the input threshold voltage of an P-type MOSFET. A clamp circuit connected to the output of the level shifter circuit prevents this output voltage from becoming greater than a voltage equal to the sum of the input threshold voltage of an N-type MOSFET and the input threshold voltage of a P-type MOSFET. The gate of the second N-type MOSFET receives the output of the level shifter as clamped by the clamp circuit. The current mirror circuit has a current input supplied by the source-drain current of both the first N-type MOSFET and the second N-type MOSFET. The current output of the current mirror circuit supplies the current control input of the ring oscillator.

A second embodiment includes a new ring oscillator. The voltage to current converter supplies two pair of N-type MOSFETs. The gate of one N-type MOSFET of each pair receives the input voltage. The gate of the other N-type MOSFET of each pair receives the voltage shifted signal. The ring oscillator includes two phase control circuits, one for opposite phases of the oscillatory output. Each phase control circuit has a current input supplied by a pair of N-type MOSFETs. The first phase control circuit controls the length of one phase of the oscillatory signal corresponding to the current input. The second phase control circuit controls the length of the opposite phase of the oscillatory signal. Each phase control circuit includes a first inverter having a current output controlled by the pair of N-type MOSFETs, a capacitor connected to the output of the first inverter, a two input NAND gate having one input connected to the capacitor and a second inverter whose input is connected to the NAND gate and whose output is connected to the input of the first inverter. The NAND gates are cross connected via their second inputs to operate in opposite phases. Each phase control circuit controls the length of one phase of the oscillatory output. Because the circuits are identical, they can be matched to produce a 50% duty cycle desirable for clocks used by microprocessors.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
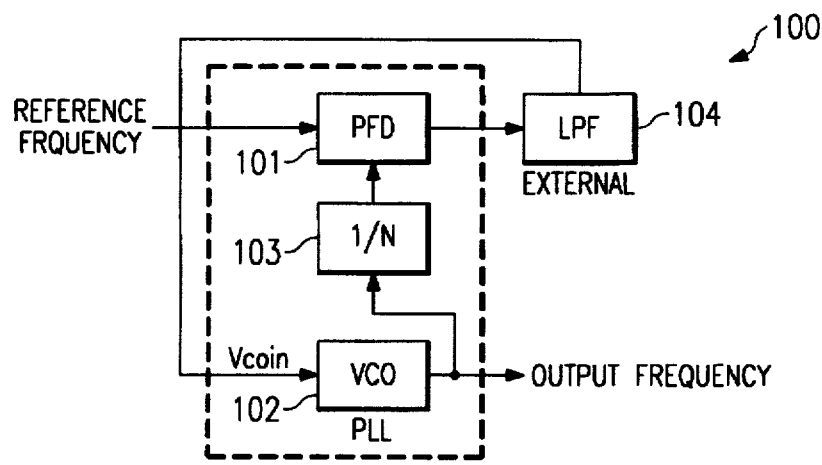
FIG. 1 illustrates in block diagram form a typical phase locked loop circuit in accordance with the prior art.

FIG. 1 illustrates a typical phase locked loop circuit 100 such as known in the art. This phase locked loop circuit 100 consists of phase/frequency detector 101, voltage controlled oscillator 102, frequency divider circuit 103 and low pass filter 104. In accordance with the known art, phase/frequency detector 101 detects the phase and/or frequency difference between a reference frequency, generally produced by a very stable frequency source such as a crystal oscillator, and a signal derived from voltage controlled oscillator 102. This detected difference is fed to low pass filter 104. The filtered output of low pass filter 104 supplies the control voltage to the input of voltage controlled oscillator 102. Voltage controlled oscillator 102 generates the desired output signal. Voltage controlled oscillator 102 also supplies frequency divider circuit 103. The output of frequency divider circuit 103 is the signal derived from the voltage controlled oscillator supplied to the phase/frequency detector 101. The phase locked loop circuit acts like a negative feedback system with the output of low pass filter 104 serving as the feedback error source. Once stably locked on the reference frequency, the phase locked loop circuit output is nearly as stable as the reference frequency source. Control of the division ratio of frequency divider circuit 103 permits the phase locked loop circuit to generate selected multiples of the reference frequency.

Phase locked loop circuits have many known uses. Recently, phase locked loop circuits have been applied to supply the clock signals of microprocessors. This use permits the logic core of the microprocessor to operate at a multiple of its external bus frequency. In conjunction with instruction and data caches, microprocessors can be made to operate at much higher frequencies than easily obtained external to integrated circuits. In addition, since the power consumed by a microprocessor is directly related to its frequency of operation, it is possible to control power consumption within the microprocessor by controlling the division ratio of the frequency divider circuit in a phase locked loop circuit generating the microprocessor clock signal. This may be very important for battery powered equipment.

Figure 2:
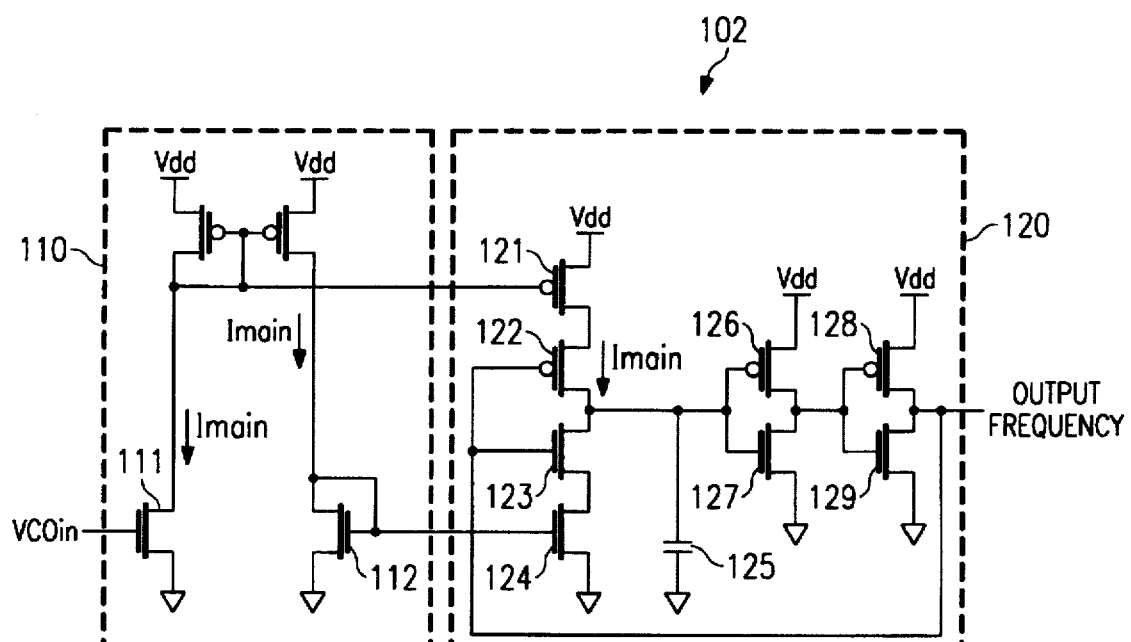
FIG. 2 illustrates in schematic diagram form a typical voltage controlled oscillator circuit in accordance with the prior art.

FIG. 2 illustrates a typical known voltage controlled oscillator such as employed in microprocessor phase locked loops. The voltage controlled oscillator consists of a current mirror 110 and a ring oscillator 120. The voltage input $VCO_{in}$ controls a primary current $I_{main}$ via the base of N-type MOSFET 111. The current mirror 110 mirrors the primary current $I_{main}$ though N-type MOSFET 112. The current through N-type MOSFET 112 controls the voltages supplied to the gates of P-type MOSFET 121 and N-type MOSFET 124. This controls the conductivity of these MOSFETs, which in term controls the time needed to charge and discharge capacitor 125. Ring oscillator 120 includes a first stage of MOSFETs 121, 122, 123 and 124 and capacitor 125, a second stage of MOSFETS 126 and 127 and a third stage of MOSFETs 128 and 129. A high conductivity for MOSFETs 121, 122, 123 and 124 corresponding to a high current $I_{main}$ means that capacitor 125 is charged and discharged at a rapid rate enabling a high frequency output. A low conductivity corresponding to a low current $I_{main}$ results in a low frequency. Thus the input voltage $VCO_{in}$ controls the output frequency of voltage controlled oscillator 102.

FIG. 2 shows ring oscillator 120 as having three stages for the purposes of illustration only. This is the minimum number of stages needed to construct a ring oscillator. It is known in the art to provide an odd number of stages having a total inverter minimum delay time providing a period corresponding to the highest desired frequency output. More stages are added to shift the highest desired frequency down into the desired range of frequencies. The number of additional inverters needed for this purpose depends upon the minimum delay in the inverter stages. Those skilled in the art would also realize that the ring oscillator could include a number of taps between stages, with the tap used corresponding to the desired frequency range. Since these features are known in the art and are not pertinent to this invention, only three stages will be illustrated in the ring oscillators shown in this application.

The conventional voltage controlled oscillator 102 illustrated in FIG. 2 has a problem. The active voltage range of voltage input $VCO_{in}$ is between $V_{dd}$, the positive supply voltage, and $V_{tn}$, the turn on threshold voltage of the input N-type MOSFET 111. When the voltage input $VCO_{in}$ is between $V_{ss}$ or ground and $V_{th}$, input N-type MOSFET 111 is cut off. Thus current $I_{main}$ is zero, and there is no control of the frequency of the ring oscillator. This is illustrated in curve 201 of FIG. 4. This is disadvantageous due to reduction of possible control range. With the continued migration to smaller devices and lower power supply voltages, the percentage of potential useful control range lost due to the turn on voltage threshold $V_{th}$ becomes greater.

Figure 3:
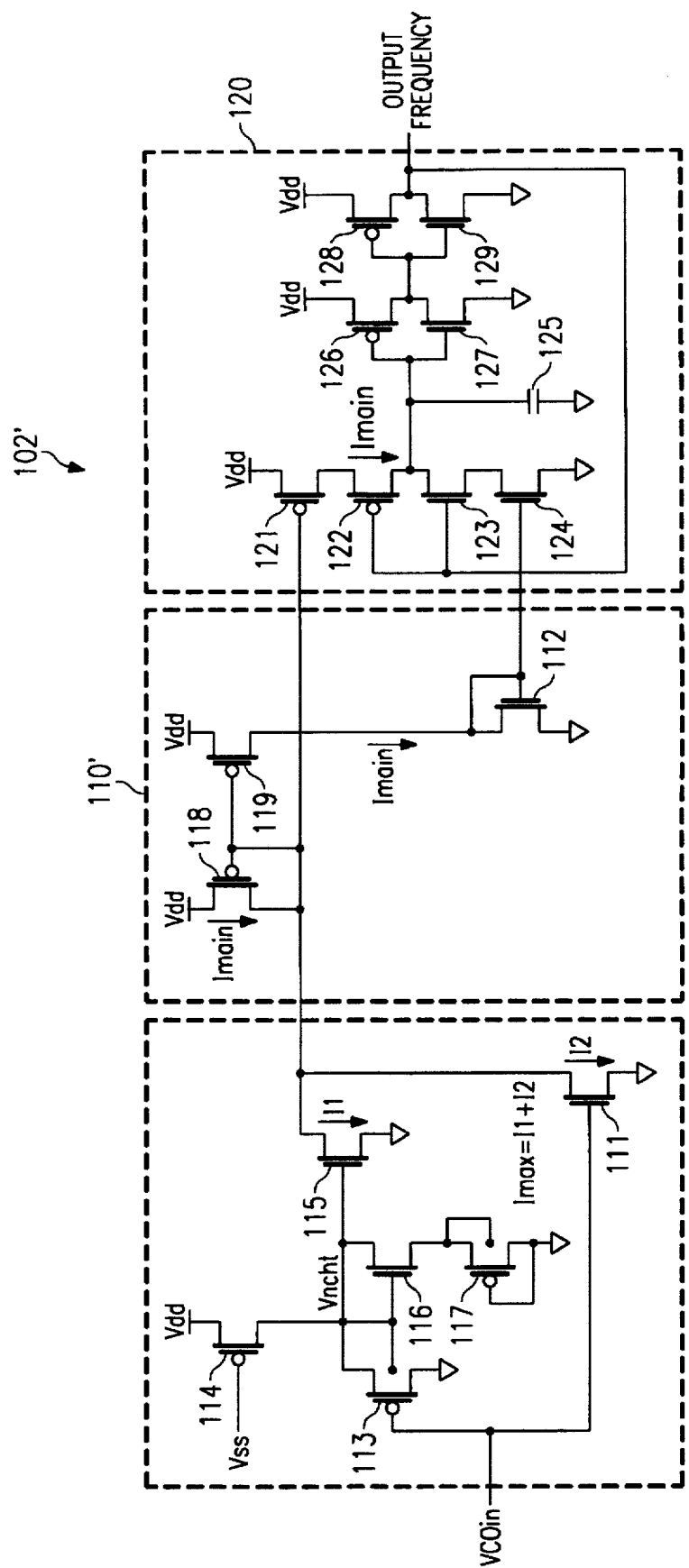
FIG. 3 illustrates in schematic diagram form the voltage controlled oscillator circuit in accordance with this invention.

FIG. 3 illustrates the voltage controlled oscillator 102' of this invention. This voltage controlled oscillator 102' employs a complementary input circuit to permit a control range of $VCO_{in}$ of $V_{ss}$ to $V_{dd}$. The current $I_{main}$ in the input of the current mirror is divided into two parts. In a first path N-type MOSFET 111 carries the same current as previously described above in conjunction with FIG. 2. The current through N-type MOSFET 111 is as illustrated in curve 201 in FIG. 4. In a second path N-type MOSFET 115 carries a complementary current as illustrated in curve 202 in FIG. 4. The sum of these currents, which the current mirror circuit consisting of P-type MOSFETs 118 and 119 and N-type MOSFET 112 forms a relatively straight voltage to current relationship as illustrated at curve 203 in FIG. 4.

The complementary input circuit provides a voltage $V_{ncht}$ to the gate of N-type MOSFET 115, which provides the second part of the current input to the current mirror. This voltage is developed in two parts. The P-type MOSFETs 113 and 114 supply the first part of this voltage $V_{ncht}$. The N-type MOSFET 116 and the P-type MOSFET 117 supplies the second part of this voltage $V_{ncht}$. In the first part of the circuit, the source-drain current $I_{p0}$ of P-type MOSFET 114 is:

$$I_{p0} = \mu_{p0} C_{ox} \frac{W_{p0}}{L_{p0}} \left\{ (V_{dd} - V_{tp})(V_{dd} - V_x) - \frac{1}{2}(V_{dd} - V_x)^2 \right\}$$

for $V_{tp} \leq V_x \leq V_{dd}$ and is:

$$I_{p0} = \mu_{p0} C_{ox} \frac{W_{p0}}{L_{p0}} \frac{1}{2}(V_{dd} - V_{tp})^2$$

for $0 \leq V_x \leq V_{tp}$ where: $I_{p0}$ is the source-drain current of P-type MOSFET 114; $\mu_{p0}$ is the carrier (hole) mobility in P-type MOSFET 114; $W_{p0}/L_{p0}$ is the channel width to length ratio of P-type MOSFET 114; $C_{ox}$ is the gate oxide capacitance; $V_{dd}$ is the positive power supply voltage; $V_{tp}$ is the turn on threshold voltage P-type MOSFET 114; and $V_x$ is the voltage at the junction between P-type MOSFETs 114 and 113. On the other hand the current $I_{p1}$ of P-type MOSFET 113 is:

$$I_{p0} = \mu_{p0} C_{ox} \frac{W_{p1}}{L_{p1}} \left\{ \frac{1}{2}(V_x^2 - (V_{tp} + VCO_{in})V_x \right\}$$

for $V_x \geq V_{tp} + VCO_{in}$ where: $I_{p1}$ is the source-drain current of P-type MOSFET 113; $\mu_{p1}$ is the carrier (hole) mobility in P-type MOSFET 113; $W_{p1}/L_{p1}$ is the channel width to length ratio of P-type MOSFET 113; and $VCO_{in}$ is the input signal to the voltage controlled oscillator. Assuming that the width to length ratio of P-type MOSFET 113 much greater than the width of length ratio of P-type MOSFET 112, that is:

$$\frac{W_{p0}}{L_{p0}} << \frac{W_{p1}}{L_{p1}}$$

then the voltage $V_{nchs}$ at the gate of N-type MOSFET 115 is approximately:

$$V_{nchs} \cong V_{tp} + VCO_{in}$$

Thus P-type MOSFETs 113 and 114 serve as a level shifter, shifting the input signal supplied to the gate of N-type MOSFET 115 up by approximately the threshold voltage of a P-type MOSFET $V_{tp}$.

The N-type MOSFET 116 and the P-type MOSFET 117 act as a voltage clamp. Assuming that:

$$\frac{W_{p0}}{L_{p0}} << \frac{W_{p2}}{L_{p2}}$$

and $$\frac{W_{p0}}{L_{p0}} << \frac{W_{n0}}{L_{n0}}$$

where: $W_{p0}/L_{p0}$ is the channel width to length ratio of P-type MOSFET 114 as stated above; $W_{p2}/L_{p2}$ is the channel width to length ratio of P-type MOSFET 117; and $W_{n0}/L_{n0}$ is the channel width to length ratio of N-type MOSFET 116; then the clamped voltage is approximately $V_{tp}+V_{tn}$, where $V_{tn}$ is the threshold voltage of an N-type MOSFET. As a consequence of these two circuits the voltage $V_{nchs}$ input to the gate of N-type MOSFET is:

$$V_{nchs} \cong V_{tp} + VCO_{in}$$

for $(V_{ss} \leq VCO_{in} \leq V_m)$ and $$V_{nchs} \cong V_{tp} + V_{tn}$$

for $(V_m \leq VCO_{in} \leq V_{dd})$

Figure 4:
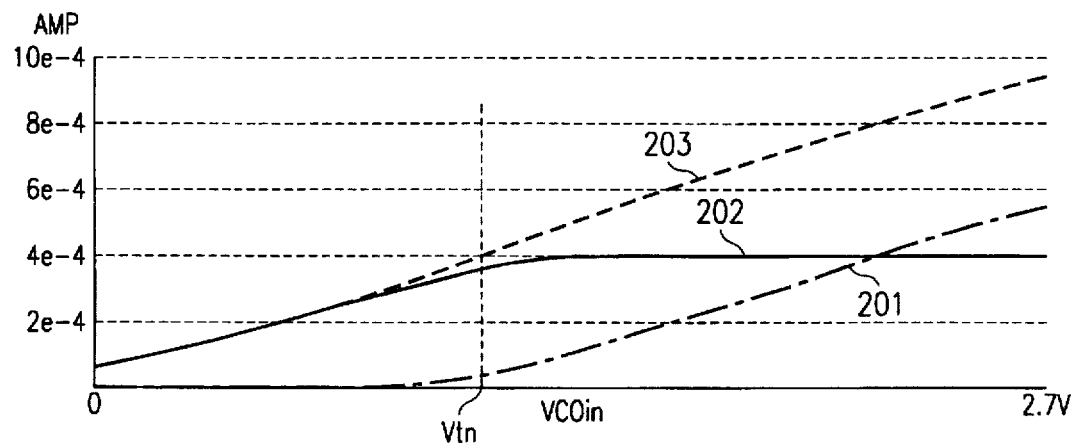
FIG. 4 illustrates a plot of the current in units of $10^{-4}$ amperes versus voltage for various parts of the voltage controlled oscillator circuit of FIG. 3.

If the width to channel length ration of N-type MOSFETs 112 and 115 are closely matched, then the resulting total current is as illustrated at curve 203 in FIG. 4. This produces a current to voltage relationship which employs a greater portion of the voltage range between ground $V_{ss}$ and the supply voltage $V_{dd}$ than the prior art circuit of FIG. 2.

The circuit illustrated in FIG. 3 does not control the length of both polarities of the clock output signal. In conventional voltage controlled oscillator the duty cycle is mainly controlled by the size of the P-type MOSFETs 121 and 122, and the N-type MOSFETs 123 and 124 connected to capacitor 124. FIG. 3 shows that P-type MOSFETs 121 and 122 charge capacitor 125 and N-type MOSFETs 123 and 123 discharge capacitor 125. The characteristic of a P-type MOSFET differs from that of an N-type MOSFET, particularly the current characteristic in the saturation region. In addition, the P-type MOSFETs are formed during differing semiconductor processing steps that the N-type MOSFETs. Thus matching the currents and thus the duty cycle is difficult using the prior art ring oscillator. Because of this conventional phase lock loops are typically only able to achieve an equal duty cycle with an error range of ±5%. This error range has a major impact on phase locked loops employed in microprocessors. It is often not possible to construct all microprocessor circuits of the edge trigger type. Some processor circuits are sensitive to not only the edge frequency but also the pulse width. Thus it would be advantageous to provide a more controlled duty cycle.

Figure 5:
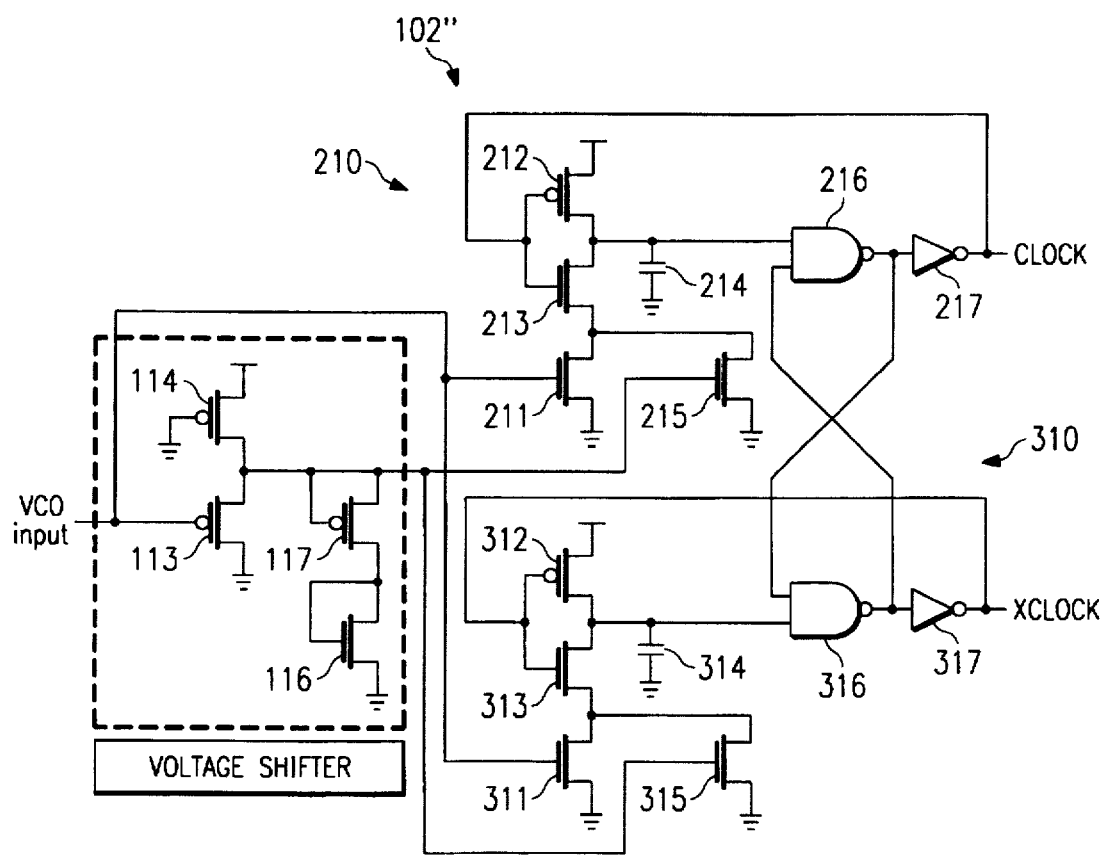
FIG. 5 illustrates in schematic diagram form the a voltage controlled oscillator in accordance with this invention employing a ring oscillator controlling both polarities of the clock output.

FIG. 5 illustrates a voltage controlled oscillator 102" in accordance with an alternative embodiment of this invention. The voltage controlled oscillator of FIG. 5 produces a first output CLOCK and an inverse output XCLOCK, each having a carefully controlled 50% duty cycle. In the preferred embodiment both clock signals are useful, however, if both signals are not needed one could be left unconnected. The voltage controlled oscillator includes a voltage shifter circuit consisting of N-type MOSFETs 113 and 117 and P-type MOSFETs 114 and 116 as previously described in conjunction with FIGS. 3 and 4. The voltage shifter circuit drives a ring oscillator including two phase control circuits 210 and 310. These are matched to accurately achieve a 50% duty cycle.

For the purpose of description, assume that CLOCK is High and XCLOCK is Low. Also assume the capacitor 214 is discharged. Consider the phase control circuit 210. The latch formed by NAND gates 216 and 316 is stable with the output of NAND gate 216 Low and the output of NAND gate 316 High. In this state P-type MOSFET 212 and N-type MOSFET 213 are both turned on and begin to charge capacitor 214. N-type MOSFETs 211 and 215 are connected to the voltage shifter circuit in a fashion similar to N-type MOSFETs 111 and 115 illustrated in FIG. 3. Accordingly, N-type MOSFETs 211 and 215 control the current through P-type MOSFET 212 and N-type MOSFET 213 according to curve 203 of FIG. 4. This controls the rate of charging capacitor 214. The voltage across capacitor 214 reaches the switching threshold of the input to NAND gate 216 in a time dependent upon the charging current and hence upon the voltage input. Reaching this switching threshold causes NAND gate 216 to change state. This changes the state of NAND gate 316 via its second input, resetting the latch to its other stable state.

This places the phase control circuit 310 in the same state as previously assumed for phase control circuit 310. The input voltage controls the charging current supplied to capacitor 314 via N-type MOSFETs 311 and 315, which operate in the same fashion as N-type MOSFETs 111 and 115 previously described. Control of the charging current controls the time required for the voltage on capacitor 314 to reach the input switching threshold of NAND gate 316. Thus phase control circuit 310 controls the length of time of the opposite phase of CLOCK and XCLOCK than phase control circuit 210.

Since the voltage controlled oscillator 102" produces two-phase non-overlapping clock signal, it possible to avoid current mirror circuits. Since voltage controlled oscillator 102" does not employ a current mirror circuit, it may reliably achieve a 50% duty cycle. The CLOCK signal controls the XCLOCK signal other phase and vice versa. The length of each clock phase is controlled by identical circuits, which can be exactly matched. Thus a reliable 50% duty cycle is achieved.

What is claimed is:

1. A voltage to current circuit comprising:

a first N-type MOSFET having a gate supplied with an input voltage;

a level shifter circuit having an input receiving said input voltage and an output supplying an output voltage which corresponds to said input voltage shifted up by a first predetermined amount;

a clamp circuit connected to said output of said level shifter circuit, said clamp circuit preventing said output voltage from becoming greater than a second predetermined voltage, said second predetermined voltage being greater than said first predetermined voltage;

a second N-type MOSFET having a gate supplied with said output voltage of said level shifter as clamped by said clamp circuit; and a current mirror circuit having a current input supplied by a source-drain current of said first N-type MOSFET and a source-drain current of said second N-type MOSFET and a current output corresponding to said current input, said current output of said current mirror circuit supplying a current output of said voltage to current circuit.

2. The voltage to current circuit of claim 1, wherein:

said level shifter circuit includes a first P-type MOSFET having a gate connected to a reference voltage and a source-drain path connected between a predetermined power supply voltage and said output of said level shifter circuit, and a second P-type MOSFET having a gate receiving said input voltage and a source-drain path connected between said reference voltage and said output of said level shifter circuit.

3. The voltage to current circuit of claim 2, wherein:

said level shifter circuit wherein said second P-type MOSFET has a channel width to length ratio much greater than a channel width to length ratio of said first P-type MOSFET.

4. The voltage to current circuit of claim 2, wherein:

said first predetermined voltage is a threshold voltage of a P-type MOSFET.

5. The voltage to current circuit of claim 4, wherein:

said level shifter circuit wherein said second P-type MOSFET has a channel width to length ratio much greater than a channel width to length ration of said first P-type MOSFET.

6. The voltage to current circuit of claim 2, wherein:

said clamp circuit includes a third N-type MOSFET having a gate connected to said output of said level shifter circuit and a source-drain path connected between said output of said level shifter and an intermediate node, a third P-type MOSFET having a gate connected to said reference voltage and a source-drain path connected between said intermediate node and said reference voltage, and said second predetermined voltage is a sum of a threshold voltage of a P-type MOSFET and a threshold voltage of an N-type MOSFET.

7. The voltage to current circuit of claim 1, wherein:

said clamp circuit includes a third N-type MOSFET having a gate connected to said output of said level shifter circuit and a source-drain path connected between said output of said level shifter and an intermediate node, a third P-type MOSFET having a gate connected to a reference voltage and a source-drain path connected between said intermediate node and said reference voltage, and said second predetermined voltage is a sum of a threshold voltage of a P-type MOSFET and a threshold voltage of an N-type MOSFET.

8. A voltage controlled oscillator circuit comprising:

a first N-type MOSFET having a gate supplied with an input voltage;

a level shifter circuit having an input receiving said input voltage and an output supplying an output voltage which corresponds to said input voltage shifted up by a first predetermined amount;

a clamp circuit connected to said output of said level shifter circuit, said clamp circuit preventing said output voltage from becoming greater than a second predetermined voltage, said second predetermined voltage being greater than said first predetermined voltage;

a second N-type MOSFET having a gate supplied with said output voltage of said level shifter as clamped by said clamp circuit;

a current mirror circuit having a current input supplied by a source-drain current of said first N-type MOSFET and a source-drain current of said second N-type MOSFET and a current output corresponding to said current input; and a ring oscillator producing an oscillating signal at an output, said ring oscillator receiving said current output of said current mirror circuit and oscillating at a frequency determined by said current output of said current mirror.

9. The voltage controlled oscillator circuit of claim 8, wherein:

said level shifter circuit includes a first P-type MOSFET having a gate connected to a reference voltage and a source-drain path connected between a predetermined power supply voltage and said output of said level shifter circuit, and a second P-type MOSFET having a gate receiving said input voltage and a source-drain path connected between said reference voltage and said output of said level shifter circuit.

10. The voltage controlled oscillator circuit of claim 9, wherein:

said level shifter circuit wherein said second P-type MOSFET has a channel width to length ratio much greater than a channel width to length ratio of said first P-type MOSFET.

11. The voltage controlled oscillator circuit of claim 9, wherein:

said first predetermined voltage is a threshold voltage of a P-type MOSFET.

12. The voltage controlled oscillator circuit of claim 11, wherein:

said level shifter circuit wherein said second P-type MOSFET has a channel width to length ratio much greater than a channel width to length ration of said first P-type MOSFET.

13. The voltage controlled oscillator circuit of claim 9, wherein:

said clamp circuit includes a third N-type MOSFET having a gate connected to said output of said level shifter circuit and a source-drain path connected between said output of said level shifter and an intermediate node, a third P-type MOSFET having a gate connected to said reference voltage and a source-drain path connected between said intermediate node and said reference voltage, and said second predetermined voltage is a sum of a threshold voltage of a P-type MOSFET and a threshold voltage of an N-type MOSFET.

14. The voltage controlled oscillator circuit of claim 8, wherein:

said clamp circuit includes a third N-type MOSFET having a gate connected to said output of said level shifter circuit and a source-drain path connected between said output of said level shifter and an intermediate node, a third P-type MOSFET having a gate connected to a reference voltage and a source-drain path connected between said intermediate node and said reference voltage, and said second predetermined voltage is a sum of a threshold voltage of a P-type MOSFET and a threshold voltage of an N-type MOSFET.

15. A voltage controlled oscillator circuit comprising:

a first N-type MOSFET having a gate supplied with an input voltage;

a second N-type MOSFET having a gate supplied with an input voltage;

a level shifter circuit having an input receiving said input voltage and an output supplying an output voltage which corresponds to said input voltage shifted up by a first predetermined amount;

a clamp circuit connected to said output of said level shifter circuit, said clamp circuit preventing said output voltage from becoming greater than a second predetermined voltage, said second predetermined voltage being greater than said first predetermined voltage;

a third of N-type MOSFET having a gate supplied with said output voltage of said level shifter as clamped by said clamp circuit;

a fourth of N-type MOSFET having a gate supplied with said output voltage of said level shifter as clamped by said clamp circuit;

a ring oscillator producing an oscillating signal at an output, said ring oscillator including a first phase control circuit having a current input supplied by a source-drain current of said first N-type MOSFET and a source-drain current of said third N-type MOSFET, said first phase control circuit controlling a first phase of said oscillating signal to have a length corresponding to a sum of said source-drain current of said first N-type MOSFET and said source-drain current of said third N-type MOSFET, and a second phase control circuit having a current input supplied by a source-drain current of said second N-type MOSFET and a source-drain current of said fourth N-type MOSFET, said second phase control circuit controlling a second phase of said oscillating signal opposite to said first phase of said oscillating signal to have a length corresponding to a sum of said source-drain current of said second N-type MOSFET and said source-drain current of said fourth N-type MOSFET, said first and second phase control circuits coupled together to operate in opposite phase.

16. The voltage controlled oscillator circuit of claim 15, wherein:

said level shifter circuit includes a first P-type MOSFET having a gate connected to a reference voltage and a source-drain path connected between a predetermined power supply voltage and said output of said level shifter circuit, and a second P-type MOSFET having a gate receiving said input voltage and a source-drain path connected between said reference voltage and said output of said level shifter circuit.

17. The voltage controlled oscillator circuit of claim 16, wherein:

said level shifter circuit wherein said second P-type MOSFET has a channel width to length ratio much greater than a channel width to length ratio of said first P-type MOSFET.

18. The voltage controlled oscillator circuit of claim 16, wherein:

said first predetermined voltage is a threshold voltage of a P-type MOSFET.

19. The voltage controlled oscillator circuit of claim 18, wherein:

said level shifter circuit wherein said second P-type MOSFET has a channel width to length ratio much greater than a channel width to length ration of said first P-type MOSFET.

20. The voltage controlled oscillator circuit of claim 16, wherein:

said clamp circuit includes a fifth N-type MOSFET having a gate connected to said output of said level shifter circuit and a source-drain path connected between said output of said level shifter and an intermediate node, a third P-type MOSFET having a gate connected to said reference voltage and a source-drain path connected between said intermediate node and said reference voltage, and said second predetermined voltage is a sum of a threshold voltage of a P-type MOSFET and a threshold voltage of an N-type MOSFET.

21. The voltage controlled oscillator circuit of claim 15, wherein:

said clamp circuit includes a fifth N-type MOSFET having a gate connected to said output of said level shifter circuit and a source-drain path connected between said output of said level shifter and an intermediate node, a third P-type MOSFET having a gate connected to a reference voltage and a source-drain path connected between said intermediate node and said reference voltage, and said second predetermined voltage is a sum of a threshold voltage of a P-type MOSFET and a threshold voltage of an N-type MOSFET.

22. The voltage controlled oscillator circuit of claim 15, wherein:

said first phase control circuit includes a first inverter having an input, an output and connected to said first N-type MOSFET and said third N-type MOSFET, a first capacitor connected between said output of said first inverter and a predetermined reference voltage, a first NAND gate having a first input connected to said output of said first inverter, a second input and an output, a second inverter having an input connected to said output of said first NAND gate and an output connected to said input of said first inverter, said output of said second inverter producing said oscillating signal; said second phase control circuit includes a third inverter having an input, an output and connected to said second N-type MOSFET and said fourth N-type MOSFET, a second capacitor connected between said output of said third inverter and a predetermined reference voltage, a second NAND gate having a first input connected to said output of said third inverter, a second input connected to said output of said first NAND gate, and an output connected to said second input of said NAND gate, a fourth inverter having an input connected to said output of said second NAND gate and an output connected to said input of said third inverter.

23. The voltage controlled oscillator circuit of claim 22, wherein:

said first phase control circuit wherein said a first inverter comprises a fourth P-type MOSFET having a gate connected to said output of said second inverter and a source-drain path connected between a predetermined supply voltage and said output of said first inverter, a sixth N-type MOSFET having a gate connected to said output of said second inverter and a source-drain path connected between said output of said first inverter and a second intermediate node, said first and third N-type MOSFETs having source-drain paths connected between said second intermediate node and said predetermined reference voltage; and said second phase control circuit wherein said a third inverter comprises a fifth P-type MOSFET having a gate connected to said output of said fourth inverter and a source-drain path connected between a predetermined supply voltage and said output of said third inverter, a seventh N-type MOSFET having a gate connected to said output of said fourth inverter and a source-drain path connected between said output of said third inverter and a third intermediate node, said second and fourth N-type MOSFETs having source-drain paths connected between said third intermediate node and said predetermined reference voltage.

24. The voltage controlled oscillator circuit of claim 22, wherein:

said second phase control circuit wherein said output of said second inverter produces a second oscillating signal having a phase opposite to a phase of said oscillating signal.

25. The voltage controlled oscillator circuit of claim 15, wherein:

said first phase control circuit and said second phase control circuit of said ring oscillator are constructed having identically matched corresponding components.

\* \* \* \* \*